(12) United States Patent
Nakajima

(10) Patent No.: US 7,705,233 B2
(45) Date of Patent: *Apr. 27, 2010

(54) FILLED SKUTTERUDITE-BASED ALLOY, PRODUCTION METHOD THEREOF AND THERMOELECTRIC CONVERSION DEVICE FABRICATED USING THE ALLOY

(75) Inventor: Kenichiro Nakajima, Chichibu (JP)

(73) Assignee: Showa Denko K.K., Tokyo (JP)

( * ) Notice: Subject to any disclaimer, the term of this patent is extended or adjusted under 35 U.S.C. 154(b) by 973 days.

This patent is subject to a terminal disclaimer.

(21) Appl. No.: 10/524,546

(22) PCT Filed: Aug. 7, 2003

(86) PCT No.: PCT/JP03/10058

§ 371 (c)(1),
(2), (4) Date: Nov. 1, 2005

(87) PCT Pub. No.: WO2004/017435

PCT Pub. Date: Feb. 26, 2004

(65) Prior Publication Data

US 2006/0118156 A1 Jun. 8, 2006

Related U.S. Application Data

(60) Provisional application No. 60/410,792, filed on Sep. 16, 2002.

(30) Foreign Application Priority Data

Aug. 13, 2002 (JP) .............................. 2002-235312

(51) Int. Cl.
*H01L 35/34* (2006.01)
*H01L 35/00* (2006.01)
*H01L 35/30* (2006.01)
*C21D 9/00* (2006.01)
*C22F 1/10* (2006.01)

(52) U.S. Cl. ........................ 136/201; 136/200; 136/205; 148/559; 148/674

(58) Field of Classification Search .................. 164/463
See application file for complete search history.

(56) References Cited

U.S. PATENT DOCUMENTS 4,572,750 A * 2/1986 Masumoto et al. .......... 148/312

(Continued)

FOREIGN PATENT DOCUMENTS

CN 1300446 A 6/2001

(Continued)

OTHER PUBLICATIONS

Kitagawa, H.; Hasaka, M.; Morimura, T.; Kondo, S., "Microstructures and thermoelectric properties of (FeSb3) 1-xLax ribbons," Thermoelectrics, 1998. Proceedings ICT 98. XVII International Conference on , vol., No., pp. 334-337, May 24-28, 1998.*

(Continued)

*Primary Examiner*—Alexa D Neckel
*Assistant Examiner*—Shannon Gardner
(74) *Attorney, Agent, or Firm*—Sughrue Mion, PLLC

(57) ABSTRACT

A method for producing a filled skutterudite-based alloy includes the steps of melting alloy raw material that includes a rare earth metal R that is at least one species selected from among La, Ce, Pr, Nd, Sm, Eu and Yb, a transition metal T that is at least one species selected from among Fe, Co, Ni, Os, Ru, Pd, Pt and Ag, and metallic antimony Sb to form a melt; and rapidly quenching the melt through strip casting to form a solidified product that is the filled skutterudite-based alloy advantageously usable for a thermoelectric element.

8 Claims, 2 Drawing Sheets

U.S. PATENT DOCUMENTS

| | | | |
|---|---|---|---|
| 5,808,233 | A | 9/1998 | Finkel et al. |
| 6,069,312 | A | 5/2000 | Fleurial et al. |
| 6,207,886 | B1 | 3/2001 | Kusakabe et al. |
| 6,322,637 | B1 * | 11/2001 | Hirota et al. ................ 148/302 |
| 7,002,071 | B1 | 2/2006 | Sadatomi et al. |
| 2002/0037453 | A1 * | 3/2002 | Knosp et al. ............. 429/218.2 |

FOREIGN PATENT DOCUMENTS

| | | | |
|---|---|---|---|
| EP | PCT/EP95/02882 | * | 2/1996 |
| EP | 1030317 A2 | * | 8/2000 |
| JP | 2000-095523 A | | 4/2000 |
| JP | 2000-252526 A | | 9/2000 |
| JP | 2001-102642 A | | 4/2001 |
| JP | 2002-026400 A | | 1/2002 |
| JP | 2002-26400 A | | 1/2002 |

OTHER PUBLICATIONS

Dean, J.A. (1999). Lange's Handbook of Chemistry (15th Edition). McGraw-Hill.*

Patent Abstracts of Japan, vol. 2002, No. 05, May 3, 2002, JP 2002 026400 A ( Toshiba Corp), Jan. 25, 2002.

Patent Abstracts of Japan, vol. 2000, No. 21, Aug. 3, 2001, JP 2001 102642 (Yamaguchi Industrial Promotion Foundation), Apr. 13, 2001.

Patent Abstracts of Japan, vol. 2000, No. 07, Sep. 29, 2000, JP 2000 095523 A (Ricoh Co. Ltd.) Apr. 4, 2000.

* cited by examiner

US 7,705,233 B2

FILLED SKUTTERUDITE-BASED ALLOY, PRODUCTION METHOD THEREOF AND THERMOELECTRIC CONVERSION DEVICE FABRICATED USING THE ALLOY

CROSS REFERENCE TO RELATED APPLICATIONS

This application is an application filed under 35 U.S.C. §111(a) claiming the benefit pursuant to 35 U.S.C. §119(e)(1) of the filing date of Provisional Application Ser. No. 60/410,792 filed Sep. 16, 2002 pursuant to 35 U.S.C. §111(b), the contents of which are hereby incorporated by reference.

TECHNICAL FIELD

The present invention relates to a filled skutterudite-based alloy for use in a thermoelectric conversion element, which converts heat directly into electricity on the basis of the Seebeck effect, to a method for producing the alloy and to a thermoelectric conversion element fabricated using the alloy.

BACKGROUND ART

Thermoelectric conversion materials formed of a filled skutterudite-based alloy have low thermal conductivity, as compared with an intermetallic compound, such as $CoSb_3$, having a skutterudite-type crystal structure, which compound is a type of conventional thermoelectric conversion materials. Therefore, such thermoelectric materials formed of a filled skutterudite-based alloy show promise as thermoelectric conversion materials for use particularly in a high-temperature range.

A filled skutterudite-based alloy is an intermetallic compound represented by the formula $RT_4Pn_{12}$ (wherein R represents a rare earth metal, T a transition metal, and Pn an element, such as P, As or Sb). In the alloy, interstitial spaces present in skutterudite-type crystals represented by formula $TPn_3$ (wherein T represents a transition metal, and Pn an element, such as P, As or Sb), are partially filled with large-mass atoms, such as rare earth metals (R). One reason why thermoelectric conversion materials formed of a filled skutterudite-based alloy have low thermal conductivity is that, when interstitial spaces included in the skutterudite-type crystals are filled with rare earth metal elements, the rare earth metal elements cause vibration, by virtue of weak bonding between the elements and Pn, thereby providing phonon scattering centers.

Appropriate selection of R or T is considered to allow selective conversion of the filled skutterudite-based alloy into either a p-type material or an n-type material. Thus, in order to select the p-type or n-type, attempts have been made to substitute elements, such as Co and Ni, for part of component T comprising Fe atoms.

The thus produced p-type and n-type filled skutterudite-based alloys are shaped into blocks, and a p-type block and an n-type block are directly or indirectly (i.e., by the mediation of a metallic conductor) joined together so as to form a p-n junction, whereby a thermoelectric conversion element can be fabricated. Alternatively, a thermoelectric conversion element module (U- or V-shape) can be fabricated by connecting p-type and n-type filled skutterudite-based alloy thermoelectric conversion members so as to form a p-n junction. As another alternative, a series of thermoelectric conversion elements having a p-n junction are connected and equipped with a heat exchanger to thereby provide a thermoelectric conversion system, through which electricity can be generated on the basis of a difference in temperature.

Conventionally, thermoelectric conversion elements have been fabricated by use of a filled skutterudite-based alloy in such a manner as comprising the steps of weighing high-purity powder materials of a rare earth metal, a transition metal, P, As, Sb, etc. so as to attain the composition of a target filled skutterudite alloy, mixing the materials, calcining the mixture at 800° C. or lower, pulverizing the calcined product, hot-press-sintering or plasma-discharge-sintering the pulverized product by heating to 800° C. and cutting the sintered product.

However, when the above method is employed, the crystal grain size of the formed filled skutterudite-based alloy is greatly affected by the conditions of material powder. In addition, there arises a problem that an increase in crystal grain size, which tends to occur when sintering conditions are not strictly controlled, causes a deteriorated performance of the fabricated thermoelectric conversion elements.

In order to avoid the above problem, there has been proposed a technique where a sintered product of Sb-containing skutterudite-based thermoelectric material, which is a type of filled skutterudite-based thermoelectric conversion material, is formed from minute skutterudite-structure crystal grains and a metal oxide is dispersed in the grain boundaries of the crystal grains (JP-A 2000-252526).

The publication discloses that the use of the above technique reduces the mean crystal grain size of the skutterudite-structure crystal grains to 20 µm or less. However, the method has a problem that the presence of metal oxide in the crystal grain boundaries lowers electric conductivity.

Another method for producing a thermoelectric conversion material formed of a filled skutterudite-based alloy is a heat treatment of ribbons fabricated through the melt-spinning method (JP-A 2002-26400). The melt-spinning method generally includes pouring a molten metal under pressure onto a roller that is rotating at high speed, from a nozzle formed of a quartz-made tube having a hole of approximately 1 mm in its tip.

However, even when the method is employed, a filled skutterudite thermoelectric conversion element having a satisfactory purity is difficult to obtain since the produced alloy ribbons assume amorphous or contain decomposition products, such as $Sb_2Fe$ and Sb. Thus, the alloy ribbons must be heated at 873 K to 1,073 K for five hours or longer so as to attain a practically usable purity, thereby constituting another problem.

Furthermore, in any of the aforementioned methods, when steps from a material preparation step to a sintering step are carried out in an oxygen-containing atmosphere, such as air, rare earth metal atoms are removed from the crystal lattice of a filled skutterudite structure by the oxidation of rare earth metals, resulting in partial decomposition of the skutterudite structure to form $Sb_2Fe$ and Sb, which is also problematic.

One object of the present invention is to provide a method for producing a filled skutterudite-based thermoelectric conversion material without requiring adoption of an alloy-pulverizing step and a pulverized product-sintering step.

Another object of the invention is to provide a filled skutterudite-based alloy advantageously usable for a thermoelectric conversion element without being modified.

Still another object of the invention is to provide a thermoelectric conversion element fabricated using the above filled skutterudite-based alloy.

DISCLOSURE OF THE INVENTION

The present invention provides a method for producing a filled skutterudite-based alloy comprising melting alloy raw material comprising a rare earth metal R that is at least one species selected from among La, Ce, Pr, Nd, Sm, Eu and Yb, a transition metal T that is at least one species selected from among Fe, Co, Ni, Os, Ru, Pd, Pt and Ag, and metallic antimony Sb to form a melt; and rapidly quenching the melt through strip casting to form a solidified product.

In the method, the alloy raw material is melted at a temperature of 800 to 1,800° C., and the melt is rapidly quenched at a cooling rate of $10^2$ to $10^{4\circ}$ C./second, as measured within a range of a temperature of the melt to 800° C.

In the method, the alloy raw material is melted in an inert gas atmosphere at a pressure higher than atmospheric pressure of 0.1 MPa and not higher than 0.2 Mpa.

In the method, the solidified product comprises alloy strips having a thickness of 0.1 to 2.0 mm.

The present invention also provides a filled skutterudite-based alloy produced through the method mentioned above, that contains a filled skutterudite phase in an amount of at least 95 mass %;

In the filled skutterudite-based alloy, the filled skutterudite-based alloy contains a filled skutterudite phase in an amount of at least 95 vol. %, and the alloy further contains a phase, other than the filled skutterudite phase, having a maximum diameter of 10 μm or less.

The filled skutterudite-based alloy contains oxygen, nitrogen and carbon in a total amount of 0.2 mass % or less.

The invention also provides a thermoelectric conversion element fabricated using the filled skutterudite-based alloy mentioned above.

The present invention adopting the strip casting as described above enables easy mass production of alloys comprising a substantially homogenous filled skutterudite phase, resulting in a great decrease in production cost.

The filled skutterudite-based alloy can be produced without being subjected to pulverizing and sintering steps and therefore has satisfactory mechanical strength and can be easily worked for producing a thermoelectric conversion element.

BEST MODES FOR CARRYING OUT THE INVENTION

The filled-skutterudite-based alloy according to the present invention contains, in an amount of at least 95 vol. %, a filled skutterudite phase represented by the formula $RT_4Sb_{12}$, wherein R stands for at least one species selected from among La, Ce, Pr, Nd, Sm, Eu and Yb, and T for at least one species selected from among Fe, Co, Ni, Os, Ru, Pd, Pt and Ag. Sb may be partially substituted by As or P.

Examples of the rare earth metal R which can be used as a raw material for producing the filled skutterudite-based alloy of the present invention include a rare earth metal (purity: 90 mass % or higher, the balance being unavoidable impurities, such as Al, Fe, Mo, W, C, O and N), and a misch metal comprising Ce and La (rare earth metal content: 90 mass % or higher, the balance being unavoidable impurities, such as Al, Fe, Mo, W, C, O and N). Examples of the transition metal T that can be used include pure iron (purity: 99 mass % or higher) and other transition metals, such as Co and Ni (purity: 99 mass % or higher). Examples of Sb that can be used include metallic antimony (purity: 95 mass % or higher, the balance being unavoidable impurities, such as Pb, As, Fe, Cu, Bi, Ni, C, O and N). The raw material for producing the filled skutterudite-based alloy of the present invention is prepared by weighing these components (R, T and metallic antimony) so as to adjust the alloy composition to $RT_4Sb_{12}$. The compositional proportions of raw materials (R, T and Sb) for producing the alloy of the present invention preferably fall within ranges of 7.5 to 8.3 mass %, 12.1 to 12.3 mass %, and 79.5 to 80.2 mass %, respectively.

Figure 1:
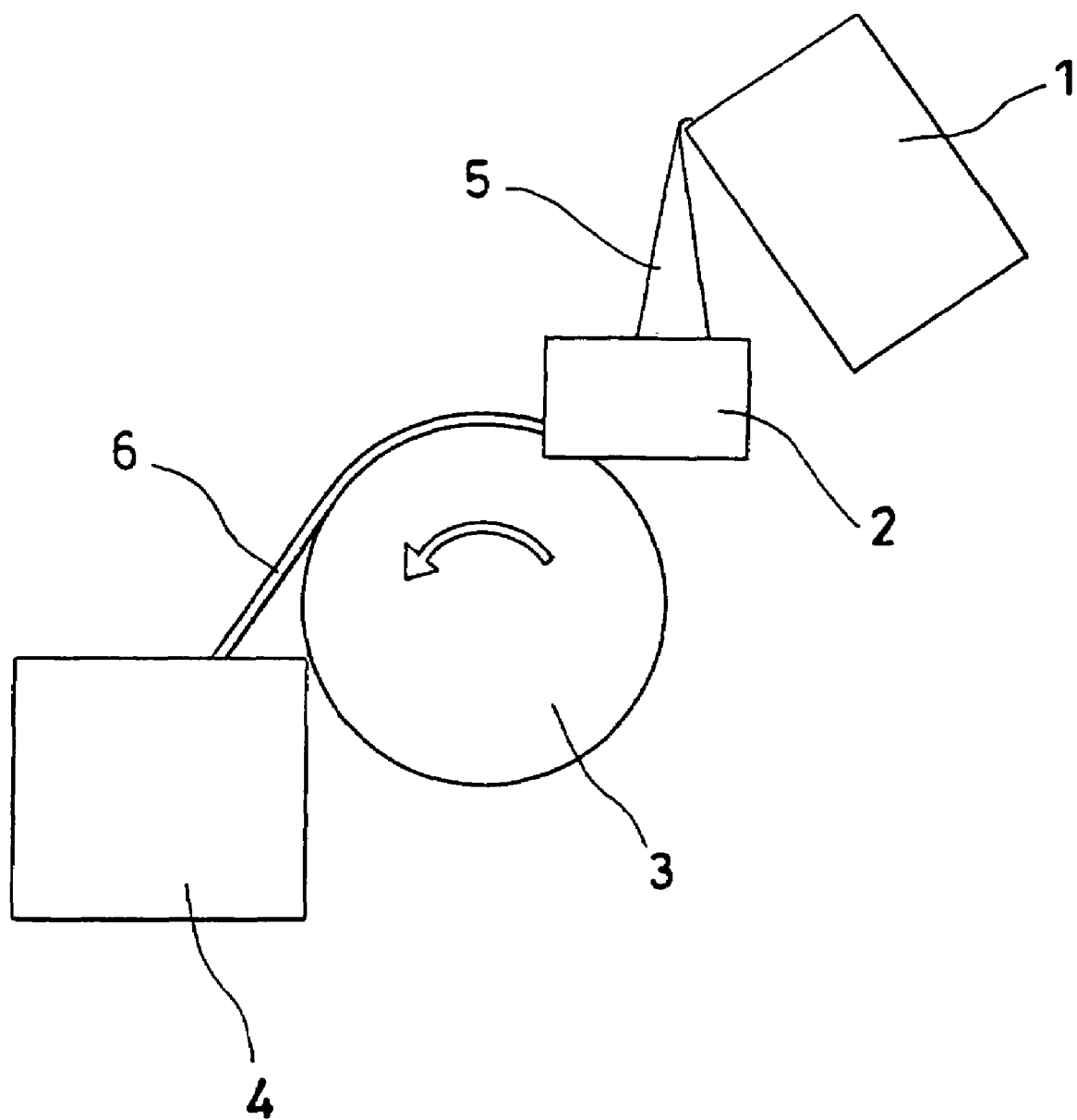
FIG. 1 is a schematic view of a strip casting production apparatus employed in the present invention.

According to the present invention, the filled skutterudite-based alloy is produced through the strip casting method (SC method). FIG. 1 shows an apparatus employed for producing the alloy through the SC method. In FIG. 1, reference numerals 1, 2, 3, 4, 5 and 6 denote a crucible, a tundish, a copper roller, a receiving box, a molten alloy and a solidified alloy strip, respectively.

According to the method for producing the filled skutterudite-based alloy of the present invention, the alloy raw material that has been prepared in the aforementioned manner is melted in the crucible 1 at 800 to 1,800° C. in an atmosphere of inert gas, such as Ar or He. In this case, the pressure of the atmosphere is preferably controlled to a pressure higher than atmospheric pressure (0.1 MPa) and no higher than 0.2 MPa, in view of the fact that the amount of vaporized Sb can be suppressed.

The molten alloy 5 prepared by melting the alloy raw material is poured via the tundish 2 onto the copper roller 3, which is cooled with water and is rotating in a direction indicated by the arrow shown in FIG. 1, to thereby rapidly quench the alloy. During this process, the cooling rate, as measured within a temperature range of the temperature of the molten alloy to 800° C., is preferably controlled to $10^2$ to $10^{4\circ}$ C./second in order to attain a metallographic structure of the alloy formed of a uniform filled skutterudite phase, more preferably to $5 \times 10^2$ to $3 \times 10^{3\circ}$ C./second. The molten alloy-cooling rate can be controlled to a desired value by modifying the rotating speed (as represented by peripheral velocity) of the copper roller 3 or by modifying the amount of the molten alloy poured onto the copper roller 3.

The solidified alloy is removed from the copper roller 3 in the form of strips 6, which are collected into the receiving box 4. The thus collected strips are cooled in the receiving box 4 to room temperature and then removed from the box. In this case, the rate of cooling the solidified alloy strips can be controlled through thermal insulation or forced cooling of the receiving box 4. By controlling the rate of cooling the thus solidified alloy strips, uniformity in the filled skutterudite phase present in the alloy can be further enhanced.

The filled skutterudite-based alloy strips produced through the SC method according to the present invention preferably have a thickness of 0.1 to 2.0 mm. Controlling the thickness of the alloy strips to 0.1 to 2.0 mm yields a filled skutterudite-based alloy that has satisfactory mechanical strength and can be easily worked for producing a thermoelectric conversion element.

Figure 2:
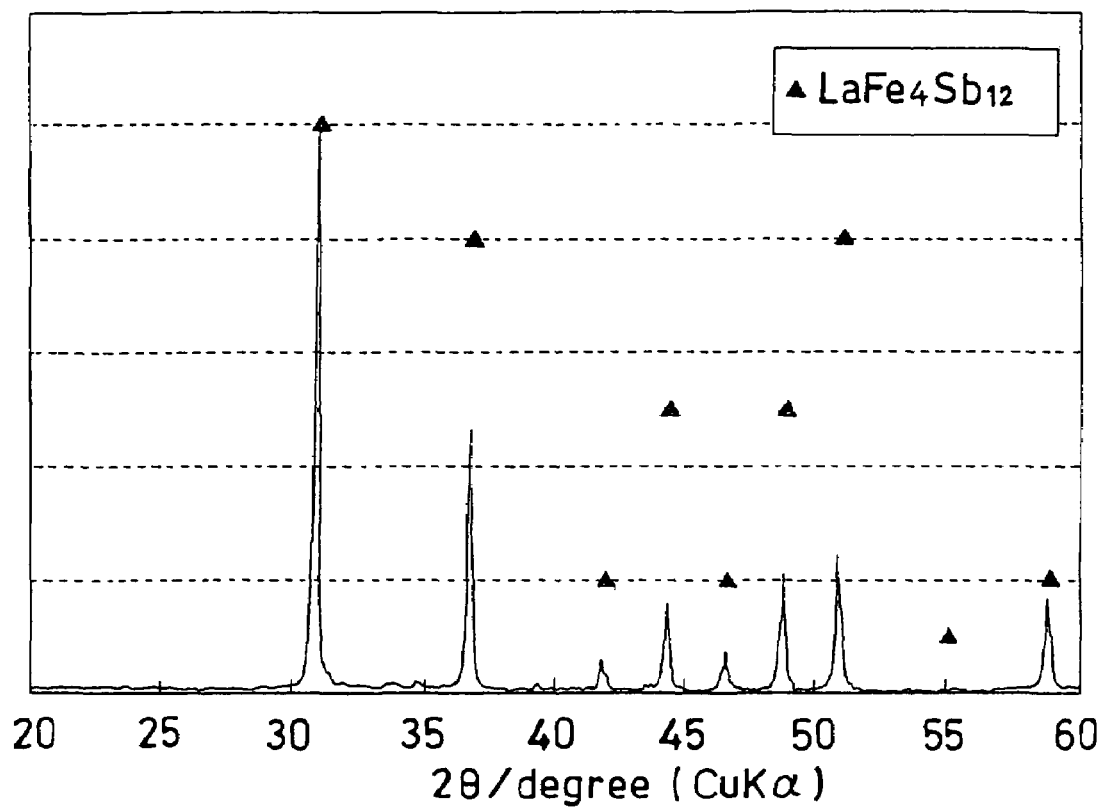
FIG. 2 is an X-ray diffraction chart of a $LaFe_4Sb_{12}$ filled skutterudite-based alloy produced in the present invention.

The filled skutterudite-based alloy of the present invention produced in the aforementioned manner exhibits a maximum peak intensity, attributed to the filled skutterudite phase, of 95% or higher as determined through identification of formed phases on the basis of the powder X-ray diffraction method, when the alloy has been removed from a production apparatus employed in the SC method and has not undergone any further heat treatment. FIG. 2 shows an identification feature of phases formed in the filled skutterudite-based alloy of the present invention through the powder X-ray diffraction method.

FIG. 2 shows X-ray diffraction measurement results of the alloy that has been removed from a production apparatus employed in the SC method and then pulverized without affording any further treatment thereto. The filled skutterudite phase content can be determined by calculating the integral intensity of the maximum peak attributed to the filled skutterudite phase, calculating the integral intensity of the maximum peak attributed to each of the phases (e.g., $Sb_2Fe$ and Sb) other than the filled skutterudite phase and dividing the integral intensity for the filled skutterudite phase by the sum of the integral intensity for the filled skutterudite phase and the integral intensities for the other phases. Specifically, the filled skutterudite phase accounts for 99 mass % or more of the alloy, as determined from the X-ray diffraction chart shown in FIG. 2.

The filled skutterudite-based alloy of the present invention produced in the aforementioned manner contains a filled skutterudite phase in an amount of at least 95 vol. %, and a phase other than the filled skutterudite phase in an amount of 5 mass % or less. It should be noted that the phase other than the filled skutterudite phase includes a phase, such as of $Sb_2Fe$ or Sb. In the alloy of the present invention, each of the phases other than the filled skutterudite phase has a maximum diameter of 10 μm or less.

Figure 3:
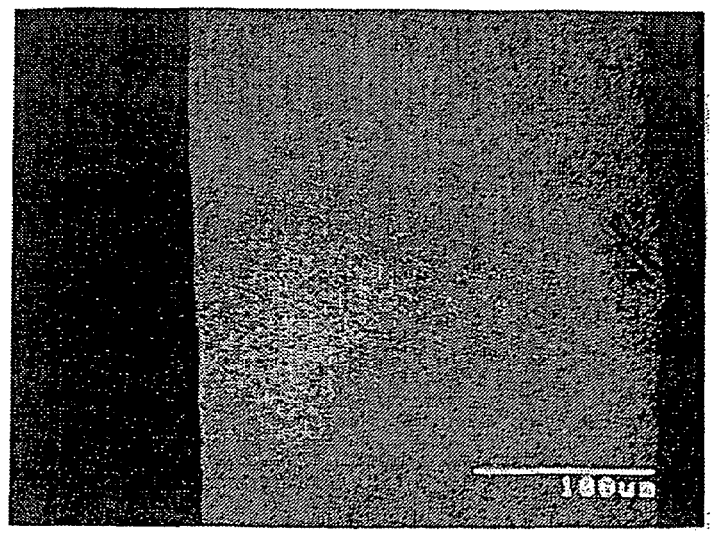
FIG. 3 is a back-scattered electron image of the cross-section of the $LaFe_4Sb_{12}$ filled-skutterudite-based alloy produced in the present invention.

The ratio by volume of the amount of the filled skutterudite phase contained in the alloy to that of a phase other than the filled skutterudite phase can be determined by calculating the ratio of the "area of the filled skutterudite phase" to the "area exhibiting contrast differing from that of the filled skutterudite phase" on the basis of a back-scattered electron image observed under a scanning electron microscope. In addition, the maximum diameter of the phase other than the filled skutterudite phase can be determined from the back-scattered electron image. FIG. 3 shows an example of the back-scattered electron image of the filled skutterudite-based alloy of the present invention observed under a scanning electron microscope. As is clear from the image, the alloy contains a virtually uniform filled skutterudite phase in an amount of 95 vol. % or more, and the phase other than the filled skutterudite phase has a maximum diameter of 10 μm or less.

According to the present invention, melting and casting can be performed in an inert atmosphere. Thus, the total amount of oxygen, nitrogen and carbon contained in the filled skutterudite-based alloy of the present invention can be suppressed to 0.2 mass % or less.

Upon production of a thermoelectric conversion element, the filled skutterudite-based alloy of the present invention is suitably used as a p-type material. Conventional substances, such as Pb-Te-based material, may be used in combination with the filled skutterudite-based alloy, as an n-type material. A p-type thermoelectric conversion member and an n-type thermoelectric conversion member are directly or indirectly (i.e., by the mediation of a metallic conductor) joined together to thereby fabricate a thermoelectric conversion element having a p-n junction. When a thermoelectric element module is fabricated, the alloy of the present invention can be used in combination with a Bi—Te-based material or Se-based compound that has excellent low-temperature characteristics or with a Co oxide-based compound that has excellent high-temperature characteristics.

The present invention will next be described in more detail with reference to Examples.

EXAMPLE 1

Metallic La that is rare earth metal, electrolytic iron and Sb were weighed such that a stoichiometric composition of $LaFe_4Sb_{12}$ was attained. The mixture was melted in an Ar atmosphere at 0.1 MPa by heating it to 1,400° C. Subsequently, by means of the strip casting apparatus shown in FIG. 1, the molten alloy was poured onto the copper roller, which was cooled with water and was rotating at a rotating speed of 0.92 m/s, at a pour rate of 150 g/s and a pour width of 85 mm to thereby produce alloy strips having a thickness of 0.28 mm. The cooling rate at the time of casting is estimated to be approximately $1 \times 10^{3}$° C./sec.

The thus produced alloy strips were pulverized, and the formed powder was analyzed through powder X-ray diffractometry. As shown in FIG. 2, almost no peak attributed to $Sb_2Fe$ or Sb was observed. The filled skutterudite phase content, as calculated on the basis of the chart, was found to be 98% or more (as $LaFe_4Sb_{12}$), and the $Sb_2Fe$ content was found to be 2% or less.

The thus produced alloy strips were further subjected to heat treatment at 550° C. for one hour in an Ar flow at atmospheric pressure. Powder X-ray diffractometry revealed that the heat-treated product has a filled skutterudite ($LaFe_4Sb_{12}$) phase content of approximately 100%. The metallographic microstructure and formed phases of the heat-treated alloy were confirmed by back-scattered electron images, and the results indicated that no phase separation was identified and that almost the entirety of the alloy was formed of a uniform filled-skutterudite phase.

EXAMPLE 2

Misch metal that is rare earth metal consisting of 53 mass % of Ce and 47 mass % of La, electrolytic iron and Sb (99%) were weighed such that a stoichiometric composition of $(Ce_x, La_{1-x})Fe_4Sb_{12}$ was attained. The mixture was melted in an Ar atmosphere at 0.1 MPa by heating it to 1,400° C. Subsequently, by means of the strip casting apparatus shown in FIG. 1, the molten alloy was poured onto the copper roller, which was cooled with water and was rotating at a rotating speed of 0.92 m/s, at a pour rate of 150 g/s and a pour width of 85 mm to thereby produce alloy strips having a thickness of 0.28 mm.

The thus produced alloy was pulverized, and the formed powder was analyzed through powder X-ray diffractometry. The results indicated that the filled skutterudite phase content, calculated from maximum peak intensities, is 98% or more (as $(Ce_x, La_{1-x})Fe_4Sb_{12}$), and the $Sb_2Fe$ content is 2% or less.

Immediately after the completion of casting the alloy, the cooling rate in the receiving box was adjusted, in an Ar atmosphere at atmospheric pressure, to 2° C./sec in a temperature range of 700° C. to 500° C. Powder X-ray diffractometry revealed that the product has a filled skutterudite ($(Ce_x, La_{1-x})Fe_4Sb_{12}$) phase content of 99% or more. The metallographic microstructure and formed phases of the heat-treated alloy were confirmed by back-scattered electron images, and the results indicated that no phase separation was identified and that almost the entirety of the alloy was formed of a uniform filled skutterudite phase.

EXAMPLE 3

Metallic La that is rare earth metal, electrolytic iron and Sb were weighed such that a stoichiometric composition of $LaFe_4Sb_{12}$ was attained. The mixture was melted in an Ar atmosphere at 0.2 MPa by heating it to 1,400° C. Subsequently, by means of the strip casting apparatus shown in FIG. 1, the molten alloy was poured onto the copper roller, which was cooled with water and was rotating at a rotating speed of 0.92 m/s, at a pour rate of 150 g/s and a pour width of 85 mm to thereby produce alloy strips having a thickness of 0.28 mm.

The thus produced alloy strips were pulverized, and the formed powder was analyzed through powder X-ray diffractometry. The results indicated that the filled skutterudite phase content, calculated from maximum peak intensities, is 95% or more (as $LaFe_4Sb_{12}$), and the $Sb_2Fe$ content is 5% or less.

The thus produced alloy strips were further subjected to heat treatment at 550° C. for one hour in an Ar flow at atmospheric pressure. Powder X-ray diffractometry revealed that the heat-treated product has a filled skutterudite ($LaFe_4Sb_{12}$) phase content of 99% or more. The metallographic microstructure and formed phases of the heat-treated alloy were confirmed by back-scattered electron images, and the results indicated that no phase separation was identified and that almost the entirety of the alloy was formed of a uniform filled skutterudite phase.

COMPARATIVE EXAMPLE 1

Metallic La that is rare earth metal, electrolytic iron and Sb were weighed such that a stoichiometric composition of $LaFe_4Sb_{12}$ was attained. The mixture was melted in a reduced pressure atmosphere of 10 Pa by heating it to 1,400° C. While the reduced pressure conditions were maintained, the molten alloy was poured onto a copper roller, which was cooled with water and was rotating at a rotating speed of 0.92 m/s, at a pour rate of 150 g/s and a pour width of 85 mm to thereby produce cast alloy strips having a thickness of 0.28 mm, in the same manner as in Example 1.

The thus produced alloy was pulverized, and the formed powder was analyzed through powder X-ray diffractometry. The results indicated that diffraction peaks were attributed almost entirely to $Sb_2Fe$ and Sb. The metallographic microstructure and formed phases of the heat-treated alloy were confirmed by back-scattered electron images, and the results indicated that the alloy was formed of a plurality of phases. The alloy was found to have an oxygen concentration higher than 0.2 mass % and an Sb content less than the stoichiometric level. Accordingly, formation of the filled skutterudite phase is considered to be impossible because of removal of the rare earth metal from the skutterudite phase and evaporation of the Sb during melting, resulting in deviation of the composition from the stoichiometry.

COMPARATIVE EXAMPLE 2

Metallic La that is rare earth metal, electrolytic iron and Sb were weighed such that a stoichiometric composition of $LaFe_4Sb_{12}$ was attained. The mixture was melted in an Ar atmosphere at 0.1 MPa by heating it to 1,400° C. Subsequently, the molten alloy was poured onto a book mold made of a copper plate (width: 10 mm, thickness: 20 mm) at a pour rate of 150 g/s to thereby produce an alloy.

The thus produced alloy was pulverized, and the formed powder was analyzed through powder X-ray diffractometry. The results indicated that diffraction peaks were almost entirely attributed to $Sb_2Fe$ and Sb. The alloy was further subjected to heat treatment at 550° C. for one hour in an Ar flow at atmospheric pressure. Powder X-ray diffractometry revealed that almost the entirety of the heat-treated product was still formed of $Sb_2Fe$ and that the alloy had virtually no filled skutterudite phase. The metallographic microstructure and formed phases of the heat-treated alloy were confirmed by back-scattered electron images, and the results indicated that the alloy was formed of a plurality of phases. Although the alloy was found to have an oxygen concentration of 0.1 mass % or less and an Sb amount almost equal to the stoichiometric level, forming a uniform filled skutterudite phase in the alloy might require heat treatment for a very long period of time.

INDUSTRIAL APPLICABILITY

According to the present invention, a filled skutterudite-based alloy of almost uniform metallographic structure can be produced in a large amount and in a simple manner through the strip casting method. The filled skutterudite-based alloy produced through the method of the present invention can be used, without pulverization and sintering, for producing a thermoelectric conversion element. Thus, cost of producing thermoelectric conversion elements can be greatly reduced.

The invention claimed is:

1. A method for producing a filled skutterudite-based alloy containing a composition of $RT_4Sb_{12}$, comprising:
   melting alloy raw material comprising a rare earth metal R that is at least one species selected from among La, Ce, Pr, Nd, Sm, Eu and Yb, a transition metal T that is at least one species selected from among Fe, Co, Ni, Os, Ru, Pd, Pt and Ag, and metallic antimony Sb at a temperature of 800 to 1,800° C. to form a melt; and
   rapidly quenching the melt at a cooling rate of $5 \times 10^2$ to $3 \times 10^{3}$° C./second, as measured within a range of the temperature of the melt to 800° C. through strip casting wherein the rapid quenching forms a solidified alloy containing a filled skutterudite phase in an amount of at least 95 mass %; and
   collecting the solidified alloy into a receiving box.

2. The method according to claim 1, wherein the alloy raw material is melted in an inert gas atmosphere at a pressure higher than atmospheric pressure of 0.1 MPa and not higher than 0.2 MPa.

3. The method according to claim 1, wherein the solidified product comprises alloy strips having a thickness of 0.1 to 2.0 mm.

4. A filled skutterudite-based alloy produced through the method according to claim 1, that contains a filled skutterudite phase in an amount of at least 95 mass %.

5. The filled skutterudite-based alloy according to claim 4, wherein it contains a filled skutterudite phase in an amount of at least 95 vol. % and further contains a phase, other than the filled skutterudite phase, having a maximum grain diameter of 10 μm or less.

6. The filled skutterudite-based alloy according to claim 4, wherein it contains oxygen, nitrogen and carbon in a total amount of 0.2 mass % or less.

7. A thermoelectric conversion element fabricated using the filled skutterudite-based alloy according to claim 4.

8. The method according to claim 1, wherein the receiving box is cooled at a rate of 2° C./second at a temperature within the range of from 700° C. to 500° C.

* * * * *